(12) United States Patent  (10) Patent No.: US 7,507,622 B2
Noda et al. (45) Date of Patent: Mar. 24, 2009

(54) SEMICONDUCTOR DEVICE AND MANUFACTURING METHOD THEREOF

(75) Inventors: Takafumi Noda, Shiojiri (JP); Masahiro Hayashi, Sakata (JP)

(73) Assignee: Seiko Epson Corporation (JP)

( * ) Notice: Subject to any disclaimer, the term of this patent is extended or adjusted under 35 U.S.C. 154(b) by 265 days.

(21) Appl. No.: 11/294,801

(22) Filed: Dec. 6, 2005

(65) Prior Publication Data

US 2006/0163623 A1 Jul. 27, 2006

(30) Foreign Application Priority Data

Jan. 27, 2005 (JP) ............................. 2005-019655

(51) Int. Cl.
*H01L 21/8242* (2006.01)
(52) U.S. Cl. .............................. 438/241; 257/E29.013; 257/E29.021
(58) Field of Classification Search .................. 438/241
See application file for complete search history.

(56) References Cited

U.S. PATENT DOCUMENTS 5,821,594 A * 10/1998 Kasai ......................... 257/410
2002/0058402 A1 * 5/2002 Wieczorek et al. .......... 438/586

FOREIGN PATENT DOCUMENTS

JP 08-181204 7/1996

* cited by examiner

*Primary Examiner*—Alexander G Ghyka
(74) *Attorney, Agent, or Firm*—Harness, Dickey & Pierce, P.L.C.

(57) ABSTRACT

A semiconductor device includes a semiconductor layer, an insulated-gate field effect transistor provided in the semiconductor layer, an etching stopper film provided above the insulated-gate field effect transistor, and an interlayer insulating layer provided above the etching stopper film; the insulated-gate field effect transistor including a gate insulating layer provided on the semiconductor layer, a gate electrode provided on the gate insulating layer, and an impurity region that constitutes a source region or a drain region provided in the semiconductor layer; wherein a removed region made by removing the etching stopper film is provided in at least part of an area that is located outside the gate insulating layer and above an area at a position other than a position sandwiched by the gate insulating layer and the impurity region.

7 Claims, 13 Drawing Sheets

(A)

(B)

(A)

(B)

(A)

(B)

(A)

(B)

SEMICONDUCTOR DEVICE AND MANUFACTURING METHOD THEREOF

The entire disclosure of Japanese Patent Application No. 2005-019655, filed Jan. 27, 2005 is expressly incorporated by reference herein.

BACKGROUND OF THE INVENTION

1. Technical Field

The present invention relates to a semiconductor device and its manufacturing method.

2. Related Art

As high integration and miniaturization of semiconductor devices have progressed in recent years, the demand for higher accuracy has grown in the alignment when a contact layer that connects wiring to a semiconductor layer is formed. Therefore, JA-8-181204, which is an example of related art, discloses a technique that forms an etching stopper film between an interlayer insulating layer and a semiconductor layer to prevent the damage to an element or a semiconductor layer even if excessive etching is performed when a contact hole is formed.

One of methods to evaluate reliability of a semiconductor device is an evaluation method that performs a bias-temperature (BT) test while exposing a device to light. This evaluation method first measures power consumption before exposing the device to light, and then measures power consumption after exposing the device to light for a certain time. It compares the obtained values of power consumption to check whether a leakage occurs or not, that is, whether a change in the characteristics of the device due to its exposure to light is present or not.

There is an idea that the presence of the etching stopper film mentioned above is related to such a characteristics change of the device due to its exposure to light, and therefore improvement is desired. In particular, a device constituting a display driver of a liquid crystal display is always exposed to light from the backlight, and therefore it is very important that the characteristics of the device do not change even though the device is exposed to light.

SUMMARY

An advantage of some aspects of the invention is to provide a semiconductor device having characteristics that do not change even though the device is exposed to light, and its manufacturing method.

A semiconductor device according to a first aspect of the invention includes a semiconductor layer, an insulated-gate field effect transistor provided in the semiconductor layer, an etching stopper film provided above the insulated-gate field effect transistor, and an interlayer insulating layer provided above the etching stopper film; the insulated-gate field effect transistor including a gate insulating layer provided on the semiconductor layer, a gate electrode provided on the gate insulating layer, and an impurity region that constitutes a source region or a drain region provided in the semiconductor layer; wherein a removed region made by removing the etching stopper film is provided in at least part of an area that is located outside the gate insulating layer and above an area at a position other than a position sandwiched by the gate insulating layer and the impurity region.

A semiconductor device according to a second aspect of the invention includes a semiconductor layer, an insulated-gate field effect transistor provided in the semiconductor layer, an etching stopper film provided above the insulated-gate field effect transistor, and an interlayer insulating layer provided above the etching stopper film; the insulated-gate field effect transistor including offset insulating layers and an isolation insulating layer provided in the semiconductor layer, a gate insulating layer provided on the semiconductor layer at least in an area sandwiched by the offset insulating layers, a gate electrode provided at least on the gate insulating layer, an impurity region that constitutes a source region or a drain region provided in the semiconductor layer between the offset insulating layer and the isolation insulating layer, and a guard ring layer provided in a region defined by the isolation insulating layer; the semiconductor device having a removed region made by removing the etching stopper film therefrom, the removed region being located outside the gate insulating layer and in at least part of an area above an area sandwiched by the gate insulating layer and the impurity region.

In the semiconductor device according to the first and second aspects of the invention, the removed region in which the etching stopper film provided above the insulated-gate field effect transistor is selectively removed is provided, enabling the provision of a semiconductor device with high reliability.

In the semiconductor device according to the former example, a leakage current sometimes increases because the device is exposed to light. It is probable that this is because electric charges are trapped into an etching stopper film, so that the induction of an inversion layer is facilitated even outside a channel region in which the inversion layer is normally induced. In the process of forming a contact layer in an interlayer insulating layer, which is performed later, however, the etching stopper film serves as a film that prevents the damage to a gate electrode and a semiconductor layer in etching for formation of an opening (contact hole). Although the etching stopper film has such a problem as described above, formation of the etching stopper film is therefore particularly needed for a semiconductor device for which miniaturization is being pursued.

In the semiconductor device according to the first and second aspects of the invention, even if the device is exposed to light, an etching stopper film is not provided in an area that possibly acts as a leakage path. That is, a removed region without the etching stopper film is provided above the leakage path. Therefore, occurrence of a leakage current can be suppressed, and as a result, a semiconductor device with improved reliability can be provided. Particularly in such a semiconductor device for high withstand voltage as the semiconductor device according to the second aspect of the invention, because its driving voltage is large, a leakage current is likely to increase. However, provision of the removed region can decrease the leakage current, having an advantage that a semiconductor device with improved reliability can be provided.

The phrase "a specific B layer (hereinafter, refer to as B layer) provided above a specific A layer (hereinafter, refer to as A layer)" used herein with regard to some aspects of the invention means either that the B layer provided directly on the A layer, or that the B layer is provided to be higher than the A layer and another layer is provided between the B layer and A layer.

The following modes may further be taken according to the aspects of the invention.

(A) In the semiconductor device according to the first aspect of the invention, furthermore, a protective film with a pattern including at least a pattern of the removed region may be provided.

(B) In the semiconductor device according to the first aspect of the invention, in the insulated-gate field effect transistor, a sidewall may be provided on a side surface of the gate electrode, and an end of the removed region may be not provided above the sidewall.

(C) In the semiconductor device according to the first aspect of the invention, an end of the protective film may be located on a top surface of the gate electrode, and a silicide layer may be provided on the gate electrode that is not covered with the protective film.

(D) In the semiconductor device according to the first aspect of the invention, one end of the removed region may be located above the top surface of the gate electrode and the protective film having a larger pattern than the pattern of the removed region may be provided, and a length of an area where the removed region above the top surface of the gate electrode does not overlap the protective film may be greater than a length of an area where the removed region in an area other than an area above the top surface of the gate electrode does not overlap the protective film.

The phrase "a length of an area . . . does not overlap" referred to herein means the shortest distance from the end of the protective film defining an unoverlapped area to the end of the removed region.

(E) In the semiconductor device according to the first aspect of the invention, the removed region may not overlap the source region and the drain region.

(F) In the semiconductor device according to the first aspect of the invention, the semiconductor device may further include a contact layer provided on the gate electrode, and the removed region may not overlap a position of the contact layer.

(G) In the semiconductor device according to the second aspect of the invention, the removed region may be provided at least above the offset insulating layer.

(H) In the semiconductor device according to the second aspect of the invention, the removed region may not overlap the guard ring layer.

A manufacturing method of a semiconductor device according to a third aspect of the invention, the method includes (a) preparing a semiconductor layer with an element formation region established, (b) forming an insulated-gate field effect transistor in the semiconductor layer, (c) forming a protective film with a prescribed pattern above the insulated-gate field effect transistor, (d) forming an etching stopper film on the insulated-gate field effect transistor including the protective film, (e) removing the etching stopper film located outside the gate insulating layer and above an area at a position other than a position sandwiched by the gate insulating layer and the impurity region that constitutes a source region or a drain region, to form the removed region, and (f) forming an interlayer insulating layer to cover the insulated-gate field effect transistor, and in the (c), the protective film with a pattern that overlaps at least a pattern of the removed region is formed.

By the manufacturing method of the semiconductor device according to the third aspect of the invention, a semiconductor device including an etching stopper film from which a prescribed region is removed can be manufactured.

In the manufacturing method of a semiconductor device according to the third aspect of the invention, the method may further include, before the (d), forming a silicide layer on at least one of the gate electrode and the impurity region, and in the (c), the protective film with a pattern remaining in an area other than an area for forming the silicide layer may be formed.

According to this mode, in the process for forming the silicide layer, the protective film is formed to protect an area for which the formation of the silicide layer is not desired. The protective film can be doubled as a protective film provided in the removed region. A semiconductor device with an etching stopper film that has a removed region provided therein can be manufactured without an unnecessary increase of the number of processes compared to the manufacturing method of a semiconductor device according to a former example.

BRIEF DESCRIPTION OF THE DRAWINGS

The invention will be described with reference to the accompanying drawings, wherein like numbers refer to like elements.

FIGS. 10A to 12B are sectional views schematically showing processes of manufacturing the semiconductor device according to the embodiment.

DESCRIPTION OF THE EMBODIMENT

An embodiment of the invention will now be described.
1. Semiconductor Device

Figure 1:
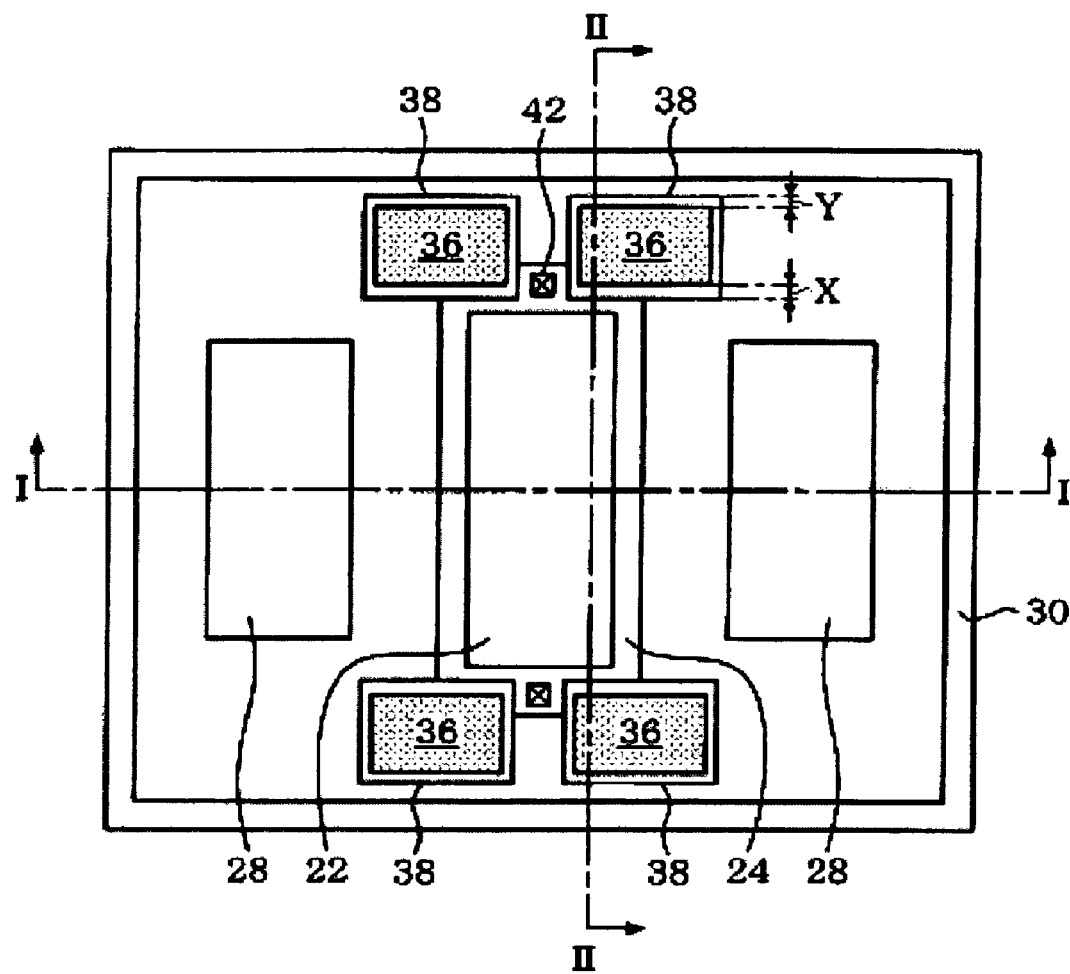
FIG. 1 is a plan view schematically showing a semiconductor device according to an embodiment.
Figure 2:
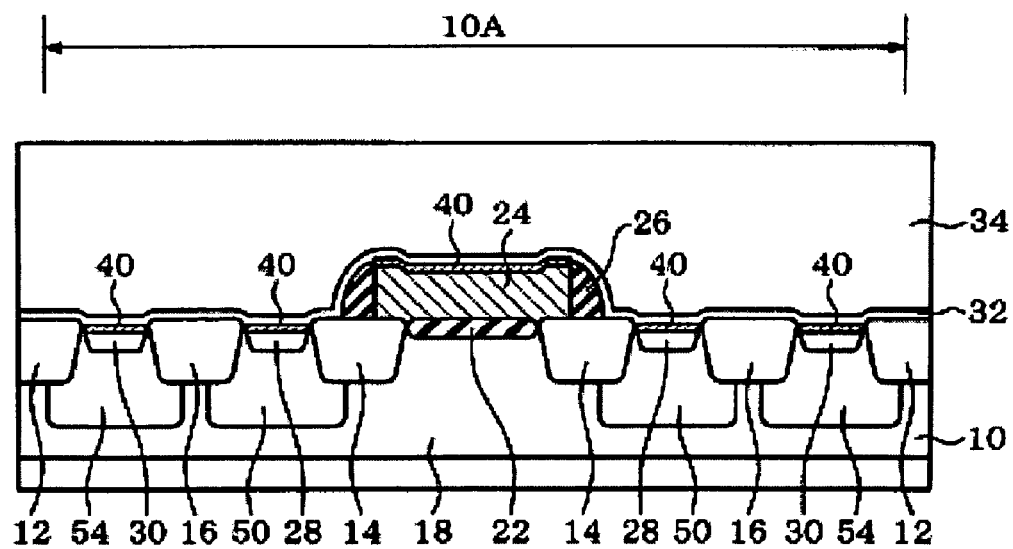
FIG. 2A is a sectional view taken along the line I-I of FIG. 1.
FIG. 2B is a sectional view taken along the line II-II of FIG. 1.
Figure 2:
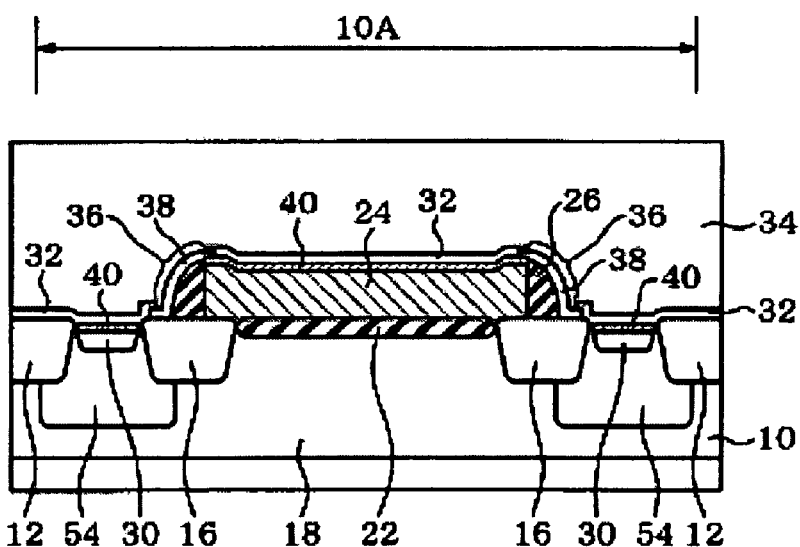

FIG. 1 is a plan view schematically showing a semiconductor device according to the present embodiment. FIG. 2A is a sectional view taken along the line I-I of FIG. 1; FIG. 2B is a sectional view taken along the line II-II of FIG. 1. FIG. 1 is a plan view that schematically shows positions of impurity regions 28 and 30, and a gate electrode 24.

As shown in FIG. 1, a semiconductor device of the embodiment is surrounded by a guard ring layer made of the impurity region 30. The impurity regions 28, either of which constitutes a source region or a drain region, are disposed such that the gate electrode 24 is located therebetween.

As shown in FIGS. 2A and 2B, an element isolation insulating layer 12 is provided in a semiconductor substrate (semiconductor layer) 10 to define an element formation region 10A. An insulated gate field effect transistor (hereinafter, also refer to as a transistor) 20 is placed within the element formation region 10A Within the element formation region 10A, offset insulating layers 14 and an isolation insulating layer 16 are provided in the semiconductor substrate 10. The offset insulating layers 14 are provided to reduce electric field concentration. The isolation insulating layer 16 is provided to separate a source region or a drain region, which will be described later, from the guard ring layer.

A gate insulating layer 22 is provided on the semiconductor substrate 10 at the position sandwiched by the offset insulating layers 14. The gate electrode 24 is provided on the gate insulating layer 22 and parts of the offset insulating layers 14. A sidewall insulating layer 26 is provided on the offset insulating layers 14 and on the side surface of the gate electrode 24. Each of the impurity regions 28, which constitutes a source region or a drain region, is provided between the offset insulating layer 14 and the isolation insulating layer 16. The impurity region 30 of a prescribed conductivity type is provided between the element isolation insulating layer 12 and the isolation insulating layer 16. This impurity region 30 constitutes a guard ring layer. A low concentration impurity layer 50, which is an offset region, is provided below the impurity region 28; a low concentration impurity layer 54, which is an offset region of the guard ring layer, is provided below the impurity region 30.

On the transistor 20, an etching stopper film 32 and an interlayer insulating layer 34 are layered one after the other. The etching stopper film 32 only has to be made of such a material that its etching selection ratio to the interlayer insulating layer 34 can be obtained; there is no other particular restriction on a material of the etching stopper film 32. For example, if the interlayer insulating layer 34 is a silicon oxide film, a silicon nitride film can be used as the etching stopper film 32. It is preferable to use as the etching stopper film, such a film that the ratio of its etching rate X to the etching rate Y of the interlayer insulating layer 30 is equal to or greater than 1:3.

The etching stopper film 32, in the semiconductor device according to the embodiment, is not provided to cover the entire surface of the transistor 20; the surface of the transistor has removed regions 36 in which the etching stopper film is not provided. Namely, the etching stopper film 32 is provided to cover the surface other than prescribed regions. Further description of a pattern of the etching stopper film 32 will be given with reference to FIG. 1.

Figure 13:
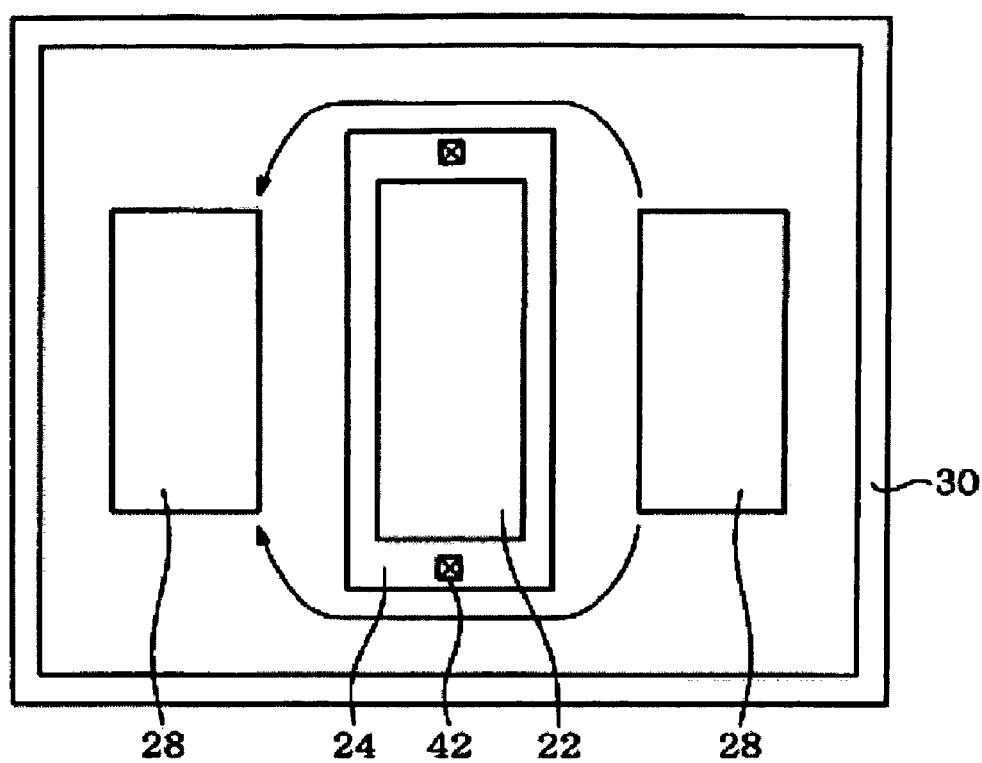
FIG. 13 is a plan view schematically showing a semiconductor device according to a former example.

A role of the removed regions 36 will first be described with reference to FIG. 13. FIG. 13 is a plan view schematically showing a semiconductor device according to a former example. FIG. 13 shows a plane that corresponds to that in FIG. 1. As shown in FIG. 13, the semiconductor device according to a former example is surrounded by a guard ring layer made of the impurity region 30, and has the impurity regions 28, each of which constitutes a source region or a drain region, disposed such that the gate electrode 24 (the gate insulating layer 22) is located therebetween. In this semiconductor device, leakage paths indicated by arrows sometimes occur between the impurity regions 28 at the outside of the gate insulating layer 22. Blocking the leakage paths is the role of the removed regions 36.

Therefore, the removed regions 36 are located in any places at least above the leakage paths. That is, an instance in which the removed regions 36 in rectangular patterns are located outside the gate insulating layer 22 is shown in FIG. 1, but the locations of the removed regions are not restricted to this instance. The removed regions only have to be located above leakage paths (the paths indicated by arrows) that can occur outside the gate insulating layer 22 (a region in which a channel is induced) between the source region 28 and the drain region 28 as shown in FIG. 13.

Places in which the removed regions 36 cannot be located will next be described. It is preferable that the removed regions 36 be not located above a silicide layer. The purpose of this is to reduce the damage to the silicide layer during the formation of a contact hole if a contact layer is provided above the silicide layer. In the semiconductor device shown in FIG. 1, since a silicide layer is provided on the impurity region 30 constituting the guard ring layer, the removed regions 36 are formed not to overlap the impurity region 30. That is, the removed regions 36 are disposed on the isolation insulating layer 16. Similarly, since a silicide layer is provided on the gate electrode 22 and the impurity regions 28, the removed regions 36 are not provided above the silicide layer.

The semiconductor device according to the embodiment has the sidewall insulating layer 26 on the side surface of the gate electrode 24 as referred to FIGS. 2A and 2B. If the sidewall insulating layer 26 is provided as in the embodiment, it is preferable that ends of the removed regions 36 be not located on the sidewall insulating layer 26. If the ends of the removed regions 36 are located on the sidewall insulating layer 26, ends of an etching stopper film are located on the sidewall insulating layer 26. Therefore, when the etching stopper film is removed, it is possible depending on a material of the sidewall insulating layer that the etching selection ratio cannot be obtained to break the shape of the sidewall insulating layer 26. To prevent this, the above measure is preferable. In the embodiment, the ends positioned near a channel region among ends of the removed regions 36 are positioned above the top surface of the gate electrode 24.

Moreover, if the removed region 36 is disposed above the top surface of the gate electrode 24 as described above, it is preferable to provide a protective film at least on the gate electrode 24 so that the gate electrode 24 is not exposed. An oxide film or the like can be used as the protective film. The protective film prevents damage to the gate electrode 24 etc., caused by etching of the etching stopper film when the removed region 36 is formed. The protective film has a pattern that overlaps the pattern of the removed region 36, and further it is preferable that the protective film have a pattern that overlaps the pattern of the removed region 36 and is larger than that, as shown in FIG. 1. A distance X from an end of the protective film 38 located above the gate electrode 24 to an end of the removed region 36 is greater than a distance Y from an end of the protective film 38 located above the isolation insulating layer 16 to an end of the removed region 36. This is because the protective film 38 has a large margin so as not to expose the gate electrode 24 even if, for example, a mask is misaligned. Therefore, a semiconductor device that can alleviate the damage to the gate electrode 24 in removing an etching stopper film to maintain the reliability can be provided.

In the semiconductor device shown in FIG. 1, a contact layer 42 for electrically connecting a wiring layer (not shown) that is provided on the upper layer is provided on the gate electrode 24. The removed regions 36, in this case, are provided in an area other than the area in which the contact layer 42 is disposed. Since an etching stopper film is removed in the removed regions 36, the absence of the etching stopper film in a region in which the contact layer 42 is formed damages the gate electrode 24 when a contact hole is formed. This manner can prevent such a problem.

According to the semiconductor device of the embodiment, even if the device is exposed to light, the removed region 36 in which the etching stopper film 32 is not provided is disposed in an area that possibly acts as leakage paths. Thus, trapping of electric charges can be suppressed, and the occurrence of a leakage path can be controlled. As a result, a semiconductor device with improved reliability can be provided.

Figure 3:
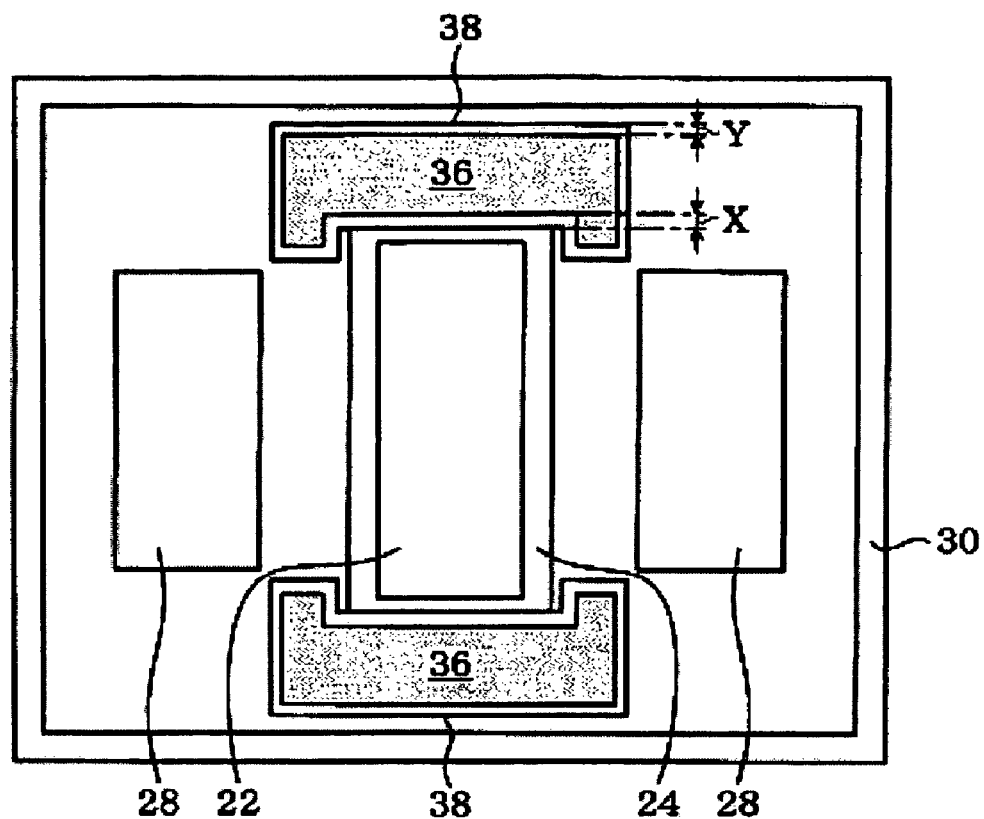
FIG. 3 is a plan view schematically showing a semiconductor device according to a modification of the embodiment.

A modification of the semiconductor device according to the embodiment will next be described. FIG. 3 is a plan view schematically showing a semiconductor device according to the modification, and illustrates a plane corresponding to that in FIG. 1.

In the semiconductor device according to the modification as shown in FIG. 3, the U-shaped removed regions 36 are provided outside the gate insulating layer 22. By forming the removed regions 36 having areas as large as possible in this manner, a decrease of leakage current can be ensured more reliably and a semiconductor device with improved reliability can be provided.

2. Manufacturing Method of Semiconductor Device

Figure 9:
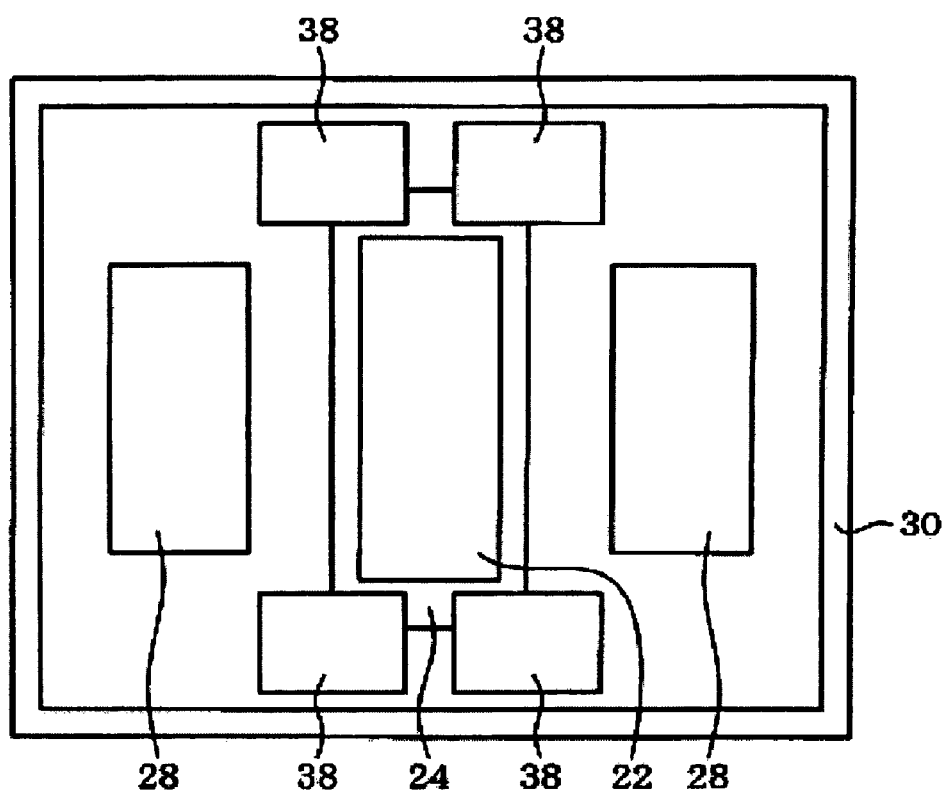
FIG. 9 is a plan view schematically showing the semiconductor device according to the embodiment.
Figure 10:
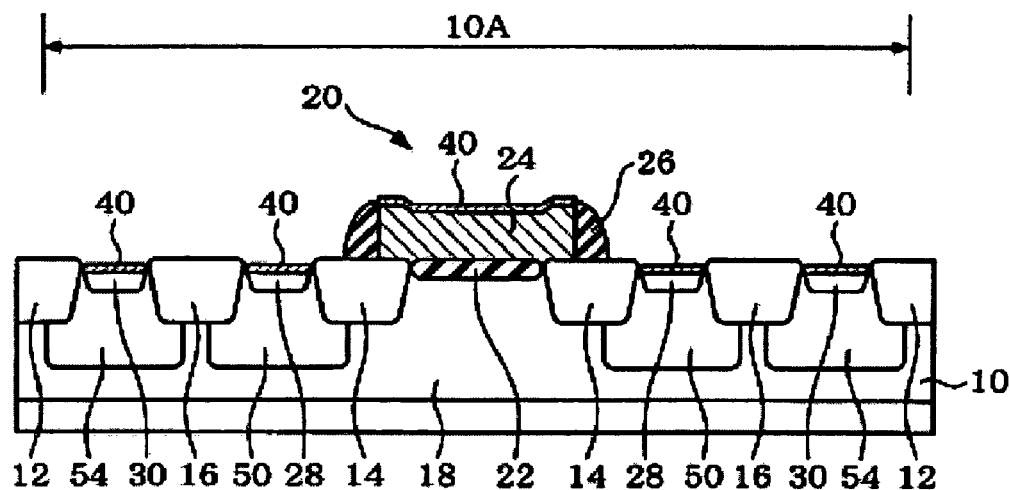
Figure 10:
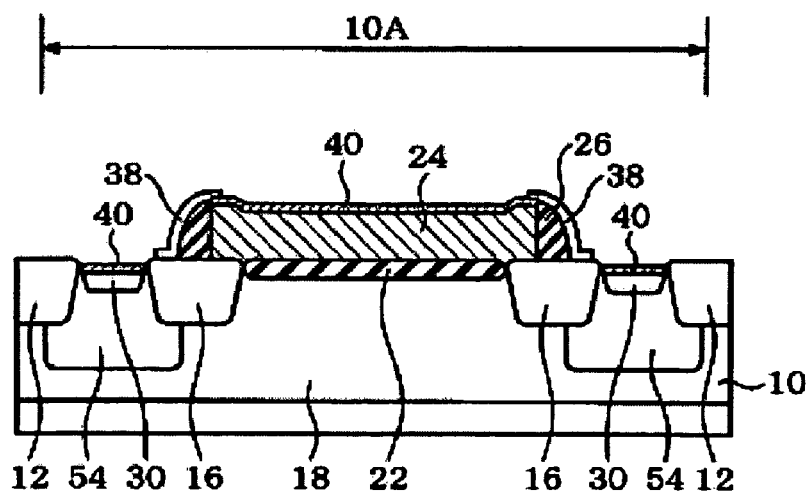
Figure 11:
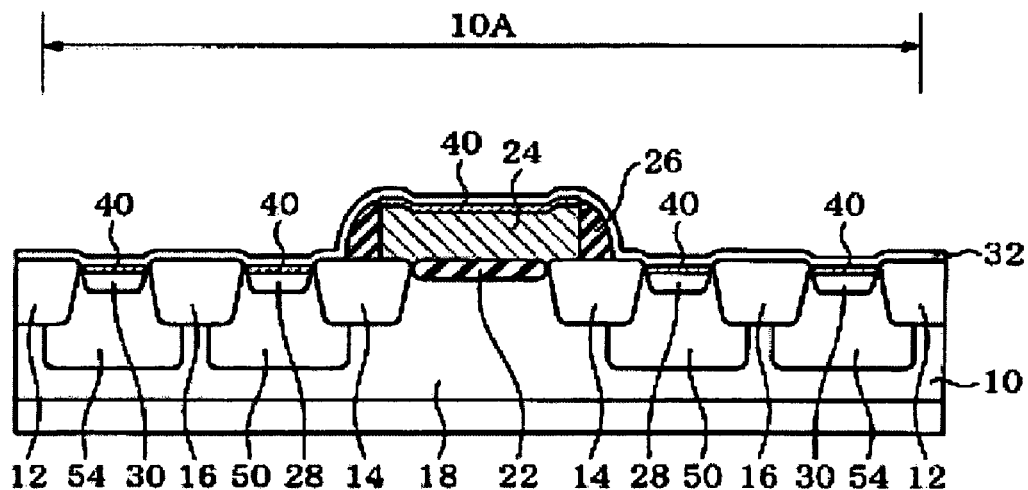
Figure 11:
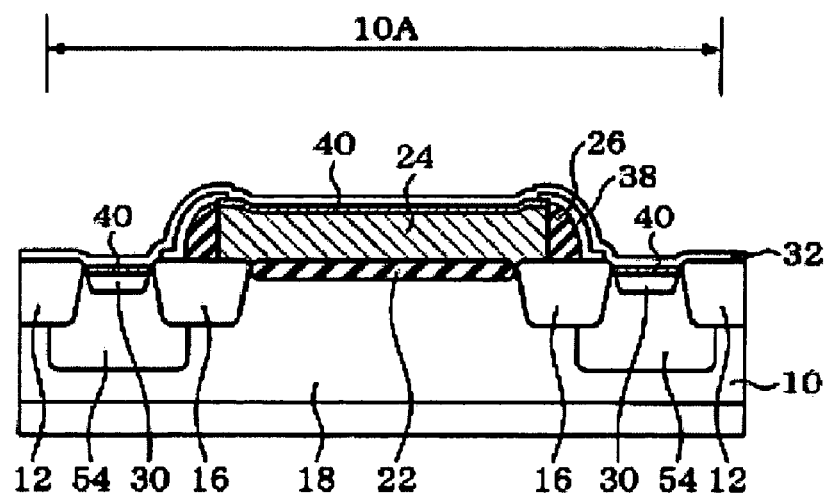
Figure 12:
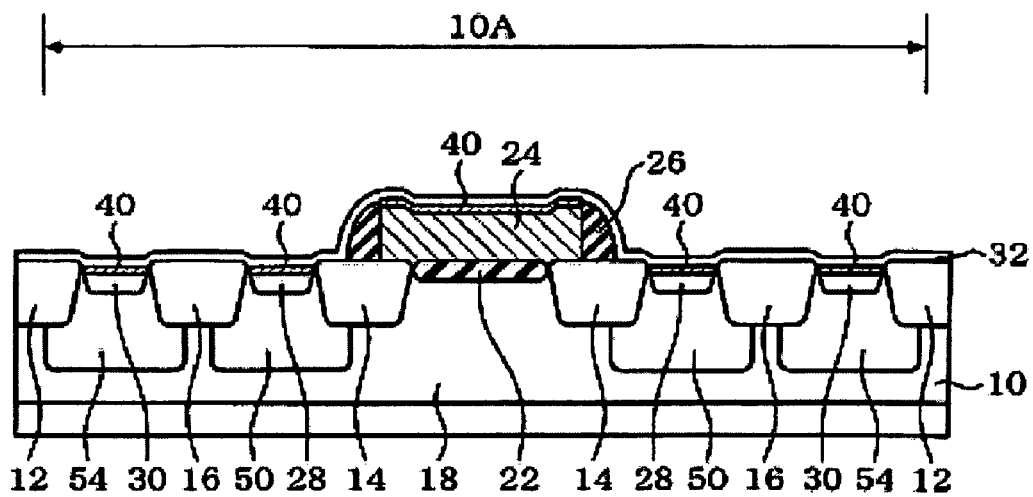
Figure 12:
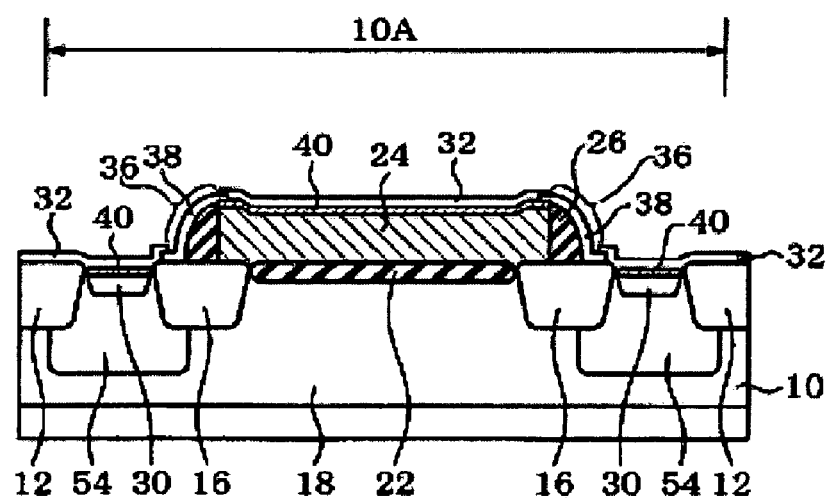

A method for manufacturing the semiconductor device of the embodiment will then be described with reference to FIGS. 4 to 12B. FIGS. 4 to 12B are sectional views schematically showing processes of manufacturing the semiconductor device according to the embodiment. FIGS. 4 to 8, FIG. 10A, FIG. 11A and FIG. 12A show sectional views corresponding to FIG. 2A FIG. 10B, FIG. 11B and FIG. 12B show sectional views corresponding to FIG. 2B. FIG. 9 shows a plane corresponding to FIG. 1.

Figure 4:
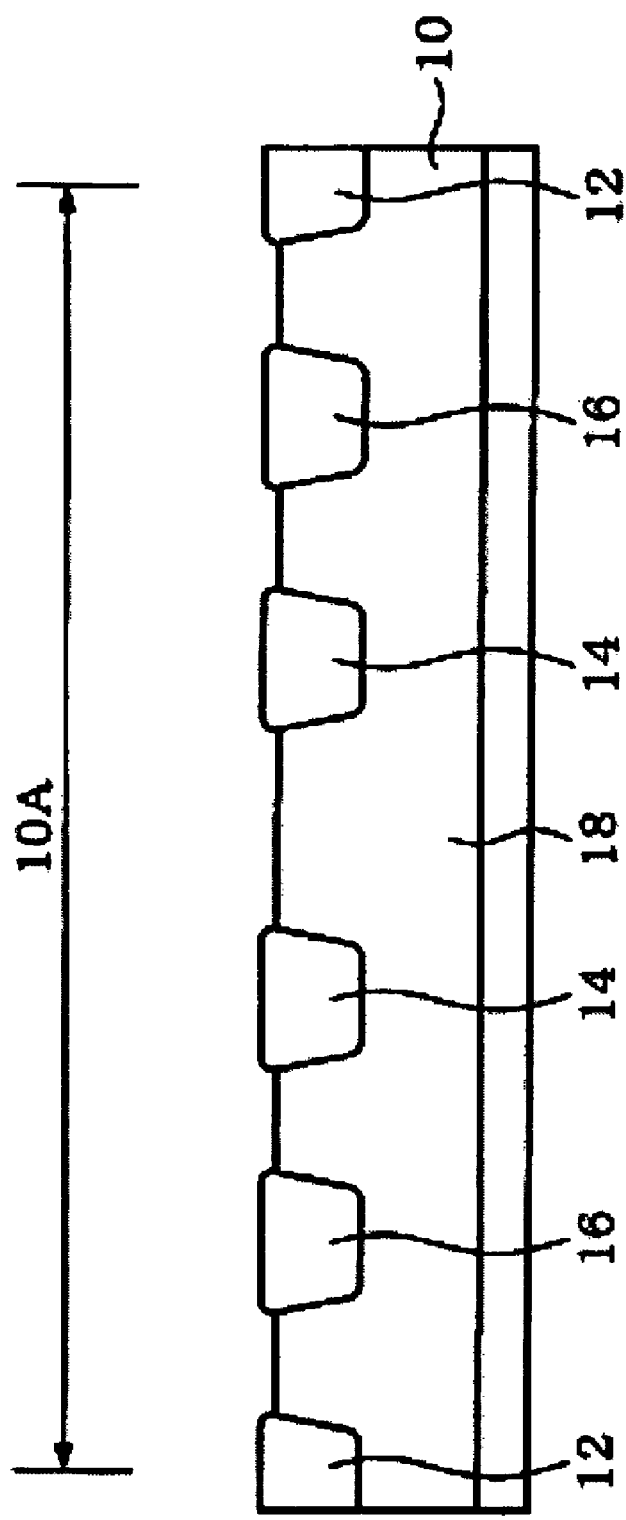
FIGS. 4 to 8 are sectional views schematically showing processes of manufacturing the semiconductor device according to the embodiment.
Figure 5:
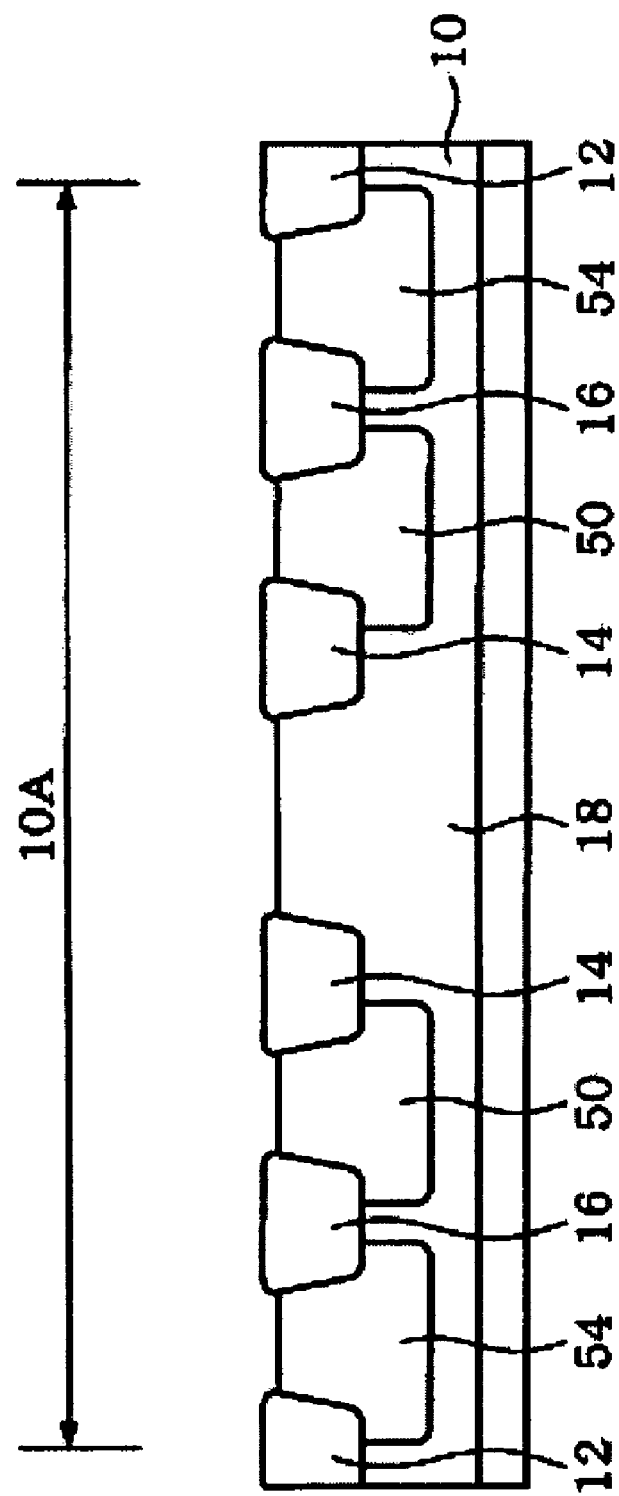

(1) First, as shown in FIG. 4, the element isolation insulating layer 12 to define the element formation region 10A, the offset insulating layers 14 to reduce electrical field concentration, and the isolation insulating layer 16 to isolate the region for forming a guard ring are formed in the semiconductor substrate 10. The element isolation insulating layer 12, offset insulating layers 14, and isolation insulating layer 16 can be formed by a local oxidation of silicon (LOCOS) method, a semi-recess LOCOS method, a shallow trench isolation (STI) method, or the like. A case using a silicon substrate as the semiconductor substrate 10 will be described below.

In the embodiment, forming the layers by a semi-recess LOCOS method will be described as an example. In the semi-recess LOCOS method, a silicon oxynitride layer and a silicon nitride layer (both not shown) are first formed one after the other on the semiconductor substrate 10 by a chemical vapor deposition (CVD) method. A mask layer (not shown) having openings in areas in which the element isolation insulating layer 12, offset insulating layers 14, and isolation insulating layer 16 are formed is then formed on the silicon nitride layer. Subsequently, the silicon nitride layer, the silicon oxynitride layer, and the semiconductor substrate 10 are etched to form a trench (not shown) in the semiconductor substrate 10.

Thereafter, a selective thermal oxidation process is performed using, the silicon nitride layer located uppermost as a mask to form the element isolation insulating layer 12, offset insulating layers 14, and isolation insulating layer 16. The top surfaces of the offset insulating layers 14 and isolation insulating layer 16 are higher than the surface of the semiconductor substrate 10 at the moment the selective thermal oxidation process ends. Therefore, these top surfaces may be etched by a known etching technique to have approximately the same height as the surface of the semiconductor substrate, if necessary.

Formation of a well 18 (refer to FIG. 4) is then performed in the element formation region 10A. In the formation of a well, a sacrificial oxide film (not shown) is first formed on the entire surface of the semiconductor substrate 10. A silicon oxide film, for example, is formed as the sacrificial oxide film. A resist layer (not shown) that covers other element formation regions (not shown) disposed together in the same semiconductor substrate 10 is formed, and an n-type impurity such as phosphorus or arsenic is implanted into the semiconductor substrate 10 one time or a plurality of times using the resist layer as a mask. The resist layer is removed, for example, by ashing and the implanted n-type impurity is thermally diffused by a heat treatment. Thus, the well 18 is formed within the semiconductor substrate 10. Formation of the well 18 may be performed if necessary.

(2) Next, an offset region for reducing the electric field concentration of the transistor is formed. In this process, after a mask layer with a prescribed pattern (not shown) is formed, an impurity of a prescribed conductivity type is introduced into the semiconductor substrate 10, thereby forming an impurity layer (not shown). Thereafter, the mask layer is removed.

An impurity for a low concentration impurity layer 54 provided below the guard ring layer 30 (refer to FIG. 1) is introduced into the semiconductor substrate 10. This process forms an impurity layer (not shown) by introducing an impurity of a prescribed conductivity type into the semiconductor substrate 10 after forming a mask layer with a prescribed pattern (not shown) in the same way as forming the impurity layer for the offset region described above.

Subsequently, the impurity layer is diffused by applying a diffusion process such as a heat treatment using a known technique to form the low concentration impurity layer 50, which constitutes an offset region of the transistor 20, and the low concentration impurity layer 54, which constitutes an offset region of the guard ring layer. Thereafter, the sacrificial oxide film is removed by a known technique.

Figure 6:
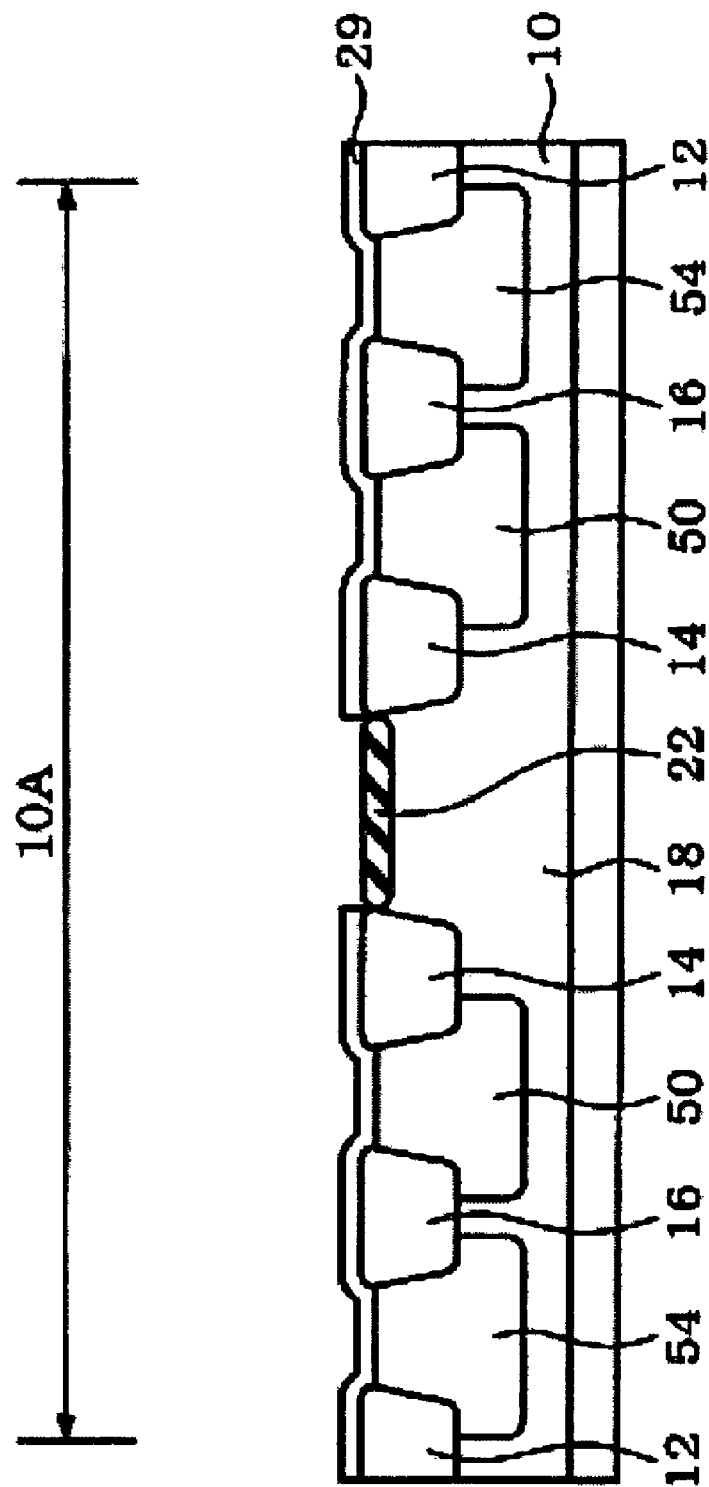

(3) A protective film 29 is formed to cover areas other than an area for forming a gate insulating layer of the transistor 20 as shown in FIG. 6. A silicon nitride film, for example, can be used as the protective film 29. For forming the protective film 29, a silicon nitride film (not shown) is first formed on the entire surface of the semiconductor substrate 10. Subsequently, a mask layer (not shown) having an opening in an area in which a gate insulating layer is formed in a later process is formed and the silicon nitride film is patterned. The protective film 29 is thereby formed.

Subsequently, the gate insulating layer 22 is formed on the semiconductor substrate 10 at the position sandwiched by the offset insulating layers 14, as shown in FIG. 6. The gate insulating layer 22 can be formed by a thermal oxidation technique. Thereafter, the protective film 29 is removed by a known technique.

(4) The gate electrode 24 (refer to FIG. 7) is then formed. For the gate electrode 24, a conductive layer (not shown) is formed on the entire surface above the semiconductor substrate 10. A polysilicon layer, for example, is formed as a conductive layer. Subsequently, after a mask layer with a prescribed pattern is formed on the conductive layer, the conductive layer is etched. The gate electrode 24 is thereby formed.

Figure 7:
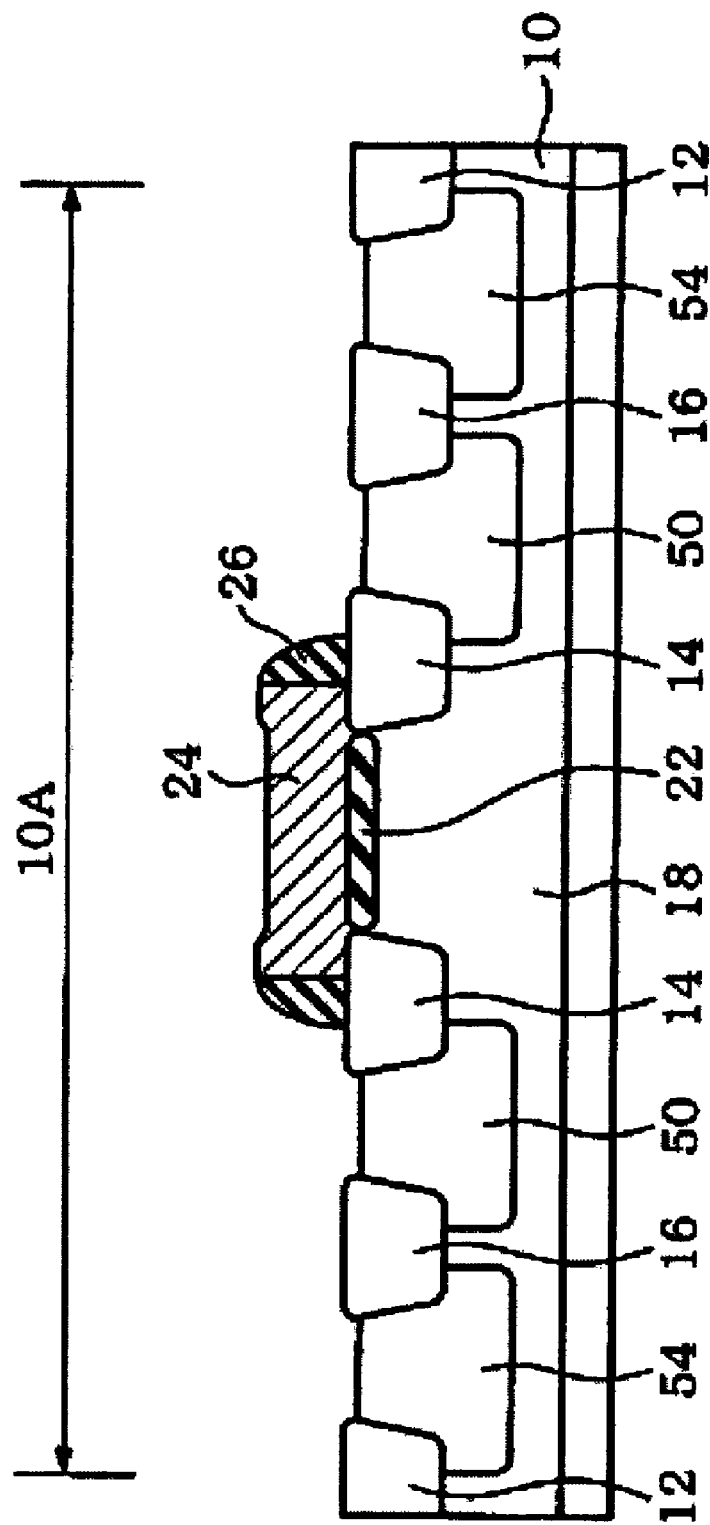
Figure 8:
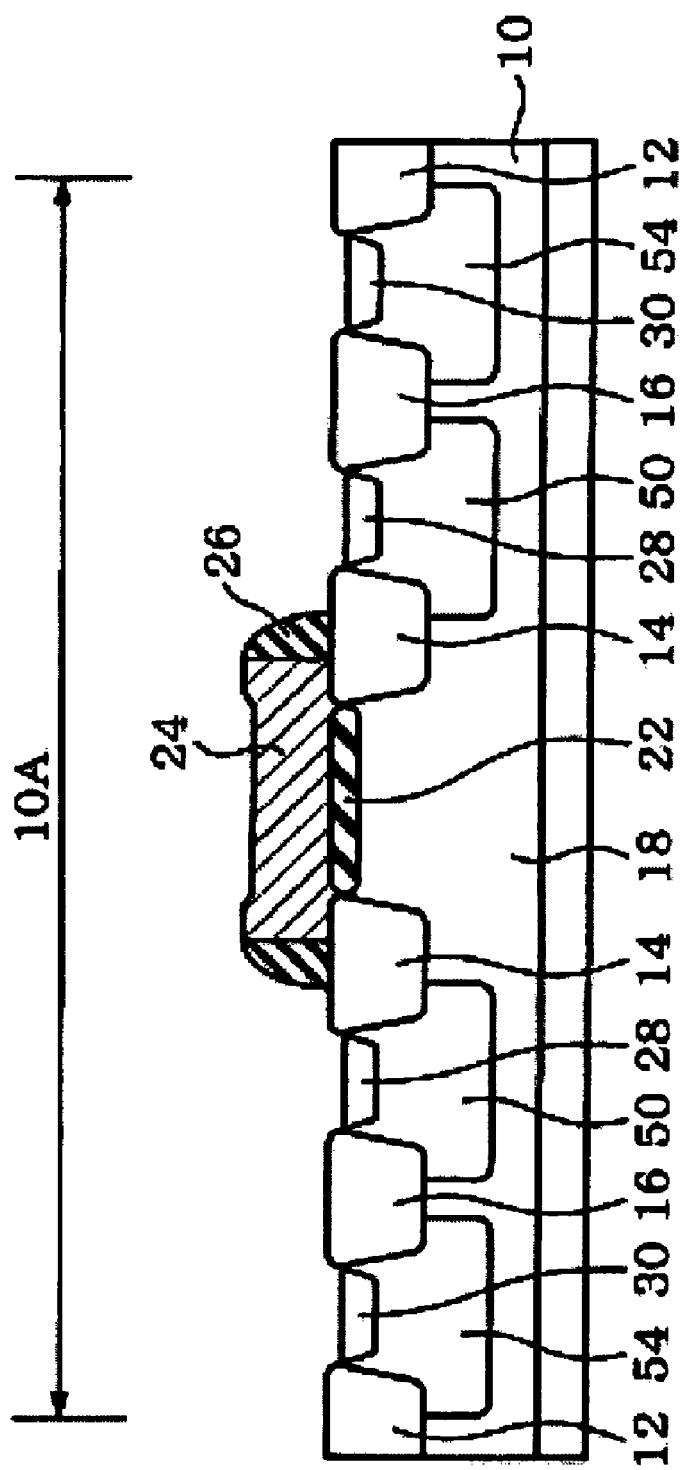

The sidewall insulating layer 26 is then formed on the side surface of the gate electrode 24, as shown in FIG. 7. After an insulating layer (not shown) is formed on the entire side surface, the insulating layer is etched by anisotropic etching. The sidewall insulating layer 26 is thereby formed.

(5) The high concentration impurity regions 28 (refer to FIG. 8), each of which constitutes a source region or a drain region, are formed. After a mask layer with a prescribed pattern is formed, an impurity is introduced, and a heat treatment for diffusion is performed if necessary, thereby forming the impurity regions 28. Subsequently, the impurity region 30 refer to FIG. 8) constituting a guard ring layer of the transistor 20 is formed. After a mask layer (not shown) covering area other than the impurity region 30 is formed, an impurity of a prescribed conductivity type is introduced into the semiconductor substrate, and a heat treatment for diffusion is performed if necessary, thereby forming the impurity region 30.

(6) Formation of a silicide layer on the gate electrode 24, impurity regions 28, and impurity region 30 is performed. In forming the silicide layer, formation of a protection film (not shown) for protecting (masking) an area in which the silicide layer formation is not desired is first performed. As the area in which the silicide layer formation is not desired, other devices and resistor elements that are not shown and disposed together on the same semiconductor substrate 10 can be mentioned. The protection film is formed, for example, by forming an insulating layer such as a silicon oxide layer (not shown) on the entire surface above the semiconductor substrate 10 that has the transistor 20 formed thereon and then patterning the formed insulating layer. In the drawings shown in the embodiment, other devices disposed together with the transistor 20 on the same substrate are not shown, and therefore the protection film is also not shown. When the protection film is patterned, in the transistor 20, the insulating layer is patterned so as to leave the insulating layer in areas in which the removed regions 36 (refer to FIG. 2B) are formed in the process described later, thereby forming the protective films 38, as shown in FIG. 9. Formation of the protective films 38 disposed in the removed regions 36 is thus performed in the same process as formation of the protection film when the silicide layer is formed. As a result, manufacturing the semiconductor device of the embodiment without increasing the number of processes more than necessary is enabled.

(7) A metal layer (not shown) is formed above the semiconductor substrate 10 to cover the transistor 20. As materials used for the metal layer, cobalt, titan, chromium, tungsten, tantalum, molybdenum, and the like can be mentioned.

Subsequently, in order to cause silicidation reaction, a hear treatment, for example, is performed. Silicide layers 40 are thus formed on the upper sides of the gate electrode 24, impurity regions 28, and impurity region 30, respectively, as shown in FIGS. 10A and 10B. Thereafter, the unreacted metal layer is removed by a known etching technique.

(8) As shown in FIGS. 11A and 11B, the etching stopper film 32 is formed above the semiconductor substrate 10 including the transistor 20 for which the silicide layer 40 is provided. The etching stopper film 32 serves as a stopper film of the etching of the interlayer insulating layer in forming a contact hole, when a contact layer for connecting the transistor 20 to various wiring layers (not shown) placed on the transistor is formed. Damage to the gate electrode 24, impurity regions 28 and 30, and element isolation insulating layer 12 can thus be suppressed.

(9) As shown in FIGS. 12A and 12B, the removed regions 36 are formed by patterning the etching stopper film 32. In the patterning, the portions of the etching stopper film 32 located above areas that are not adjacent to the impurity regions 28, each of which constitutes a source region or a drain region, at the outside of a channel region induced below the gate insulating layer 22 are removed to form the removed regions 36. The removed regions 36 are formed so as to be located on the protective films 38 formed in process (6). The removed regions 36 may be formed so as to be located on the element isolation insulating layer 12. In the semiconductor device of the embodiment, the removed regions 36 are formed by removing the portion of the etching stopper film 32 above the isolation insulating layer 16 disposed between the gate insulating layer 22 and the impurity region 30, which is a guard ring layer. Various types of patterns can be employed for the removed regions 36 and the protective films 38 as far as prescribed conditions are satisfied, as described in section 1.

The interlayer insulating layer 34 is then formed to include the etching stopper film 32 and cover the transistor 20, as referred to in FIGS. 2A and 2B. Furthermore, various wiring layers are formed above the interlayer insulating layer 34, and a contact layer connecting the wiring layers to transistor 20 is formed in the interlayer insulating layer 34, although they are not shown.

By the processes described above, the semiconductor device according to the embodiment can be manufactured.

According to the manufacturing method of the semiconductor device of the embodiment, a semiconductor device having the removed regions 36 without the etching stopper film 32, which are disposed in any places above areas that possibly act as leakage paths, can be manufactured. The protective films 38 provided in the removed regions 36 can prevent members constituting the transistor (a silicide layer, a gate electrode, etc.,) from directly having contact with the interlayer insulating layer.

In the process of forming the silicide layer 40, the protection film formed m an area in which formation of the silicide layer 40 is not desired and the protective films 38 formed in the removed regions 36 are formed by the same process. Therefore, a semiconductor device with the etching stopper film 32 having the removed regions 36 therein can be manufactured without an unnecessary increase of the number of processes.

The invention is not restricted to the embodiment described above, and various modifications can be made within the spirit and scope thereof.

What is claimed is:

1. A manufacturing method of semiconductor device, the method comprising:
   (a) preparing a semiconductor layer with an element formation region established;
   (b) forming an insulated-gate field effect transistor in the semiconductor layer;
   (c) forming a protective film with a prescribed pattern above the insulated-gate field effect transistor;
   (d) forming an etching stopper film on the insulated-gate field effect transistor including the protective film;
   (e) removing the etching stopper film located outside a gate insulating layer and above an area at a position other than a position sandwiched by the gate insulating layer and an impurity region that constitutes a source region or a drain region, to form the removed region; and
   (f) forming an interlayer insulating layer to cover the insulated-gate field effect transistor;
   wherein in the (c), the protective film with a pattern that overlaps at least a pattern of the removed region is formed.

2. The manufacturing method of a semiconductor device of claim 1, the method further comprising:
   before the (d), forming a silicide layer on at least one of a gate electrode and the impurity region;
   wherein in the (c), the protective film with the pattern remaining in an area other than an area for forming the silicide layer is formed.

3. The manufacturing method of claim 1 wherein the etching stopper film is removed over an area of the protective film.

4. The manufacturing method of claim 1 wherein the etching stopper film is removed over a part of a gate of the insulated-gate field effect transistor.

5. The manufacturing method of claim 1 wherein the etching stopper film is removed except for over the gate insulating layer between the source region and the drain region.

6. A manufacturing method of a semiconductor device, the method comprising:
   (a) forming a transistor;
   (b) forming a first insulating film above the transistor;
   (c) forming a second insulating film on the transistor and the first insulating film;
   (d) removing the second insulating film located over the first insulating film, to form a removed region; and
   (e) forming an interlayer insulating layer that covers the transistor,
   the forming of the first insulating film being carried out such that the first insulating film overlaps a part of the removed region.

7. The manufacturing method of a semiconductor device of claim 1, the method further comprising:
   forming a silicide layer on the gate electrode and the impurity region,
   the forming of the silicide layer being carrier out prior to the forming of the transistor, and
   the forming of a first insulating film being carried out such that the first insulating film is formed in an area in which the silicide layer is not formed.

* * * * *